(12) United States Patent
Kvam et al.

(10) Patent No.: US 6,857,543 B2
(45) Date of Patent: Feb. 22, 2005

(54) LOW VOLUME DISPENSE UNIT AND METHOD OF USING

(75) Inventors: Karen Kvam, Franklin, MA (US); James B. Wickman, Worcester, MA (US)

(73) Assignee: Shipley Company, L.L.C., Marlborough, MA (US)

( * ) Notice: Subject to any disclaimer, the term of this patent is extended or adjusted under 35 U.S.C. 154(b) by 116 days.

(21) Appl. No.: 10/306,560

(22) Filed: Nov. 27, 2002

(65) Prior Publication Data

US 2003/0197038 A1 Oct. 23, 2003

Related U.S. Application Data

(60) Provisional application No. 60/337,235, filed on Dec. 1, 2001.

(51) Int. Cl.[7] ............................................... B65D 25/40
(52) U.S. Cl. ..................... 222/571; 222/63; 222/334; 222/389
(58) Field of Search ............................. 222/108, 1, 52, 222/333–334, 571, 399, 327, 386, 386.5, 63, 389, 263; 239/106, 119; 118/684; 417/53, 384, 385

(56) References Cited

U.S. PATENT DOCUMENTS

| | | | | |
|---|---|---|---|---|
| 4,597,719 A | * | 7/1986 | Tano | 417/317 |
| 4,874,444 A | * | 10/1989 | Satou et al. | 156/64 |
| 5,167,837 A | | 12/1992 | Snodgrass et al. | 210/767 |
| 5,516,429 A | | 5/1996 | Snodgrass et al. | 210/767 |
| 5,599,394 A | * | 2/1997 | Yabe et al. | 118/319 |
| 5,772,899 A | | 6/1998 | Snodgrass et al. | 210/767 |
| 5,878,918 A | | 3/1999 | Liao et al. | 222/189.06 |
| 5,913,455 A | * | 6/1999 | La et al. | 222/55 |
| 5,950,924 A | * | 9/1999 | Hatakeyama et al. | 239/119 |
| 6,062,442 A | * | 5/2000 | Yang et al. | 222/571 |
| 6,105,829 A | | 8/2000 | Snodgrass et al. | 222/214 |
| 6,109,881 A | | 8/2000 | Snodgrass et al. | 417/53 |
| 6,251,293 B1 | * | 6/2001 | Snodgrass et al. | 210/767 |
| 6,332,924 B1 | * | 12/2001 | Shim et al. | 118/684 |
| 6,419,841 B1 | * | 7/2002 | Snodgrass et al. | 210/767 |
| 6,478,547 B1 | * | 11/2002 | Savard et al. | 417/53 |
| 6,598,765 B2 | * | 7/2003 | Pagel et al. | 222/214 |
| 6,602,382 B1 | * | 8/2003 | Matsuyama et al. | 156/345.11 |

OTHER PUBLICATIONS

IntelliGen Dispense System with Impact LHVD Filter: For Point–of–Use photochemical Dispense from Millipore Worldwide.

* cited by examiner

Primary Examiner—Frederick Nicolas
(74) Attorney, Agent, or Firm—S. Matthew Cairns

(57) ABSTRACT

A method for dispensing a chemical solution in the small-scale manufacture of semiconductors is provided. The method includes associating a dispensing unit with a semiconductor coat/develop track machine and a pneumatic syringe of a chemical solution with the dispensing unit. A dispensing pressure is applied to the pneumatic syringe. The flow control diaphragm is opened to allow the dispensing pressure to drive the chemical solution from the dispensing nozzle, while the drip prevention diaphragm is moved from a first position to a second position. The flow control diaphragm is closed to prevent the dispensing pressure from driving the chemical solution from the dispensing nozzle, while the drip prevention diaphragm is returned to the first position to generate a suck-back force in the flow path at the dispensing nozzle.

20 Claims, 6 Drawing Sheets

LOW VOLUME DISPENSE UNIT AND METHOD OF USING

This application claims the benefit of provisional application Ser. No. 60/337,235, filed on Dec. 1, 2001.

TECHNICAL FIELD

This application relates generally to a low volume dispense unit. More specifically, this application relates to a low volume dispense unit for filtering and dispensing chemical solutions used in the manufacture of semiconductors on a lab or development scale.

BACKGROUND

"Lithography" literally means stone writing, however the contemporary meaning is to produce a three dimensional image. "Photolithography" is a term that emerges with the discovery of photosensitive compounds used to define patterns on a printed circuit board. "Micro lithography" is a term used to describe small features using photolithography or photosensitive compounds for the manufacture of integrated circuits.

Semiconductors are manufactured using a photolithographic process. The micro lithographic process is the last step and goal in the formation of relief images. Photolithographic processes apply chemical solutions, such as photoresist, antireflective coatings (ARC) and developer solutions, onto a surface of a semiconductor. The chemical solution is applied at the recommended film thickness to a wafer. For example, after the application of photo-resist onto the wafer, an image from a template, mask or reticule (hereinafter mask) containing clear and opaque regions is transferred into the photosensitive coating on the wafer surface using a projection system. The clear and opaque regions on the mask) correspond to the desired circuit pattern.

A projection system typically consists of the following optical components, a light source, a condensing lens, and an objective lens. The projection system is either stand-alone units, or they can be linked to a machine for dispensing photolithographic solutions, commonly known as track system.

A photo resists' lithographic performance is directly affected by the developer composition. The different photoresist chemistries, in the exposed and unexposed areas are made either soluble or insoluble in a developer solution. The latent image formed by the exposure step is developed to form a relief image, corresponding to the desired circuit pattern.

Photolithography processes occur in a clean room or a temperature and humidity controlled environment, and track systems typically further include controlled chamber environment. In the example where the semiconductor is manufactured in a track system having a chamber environment, the chamber is typically circulated with highly filtered air. The semiconductor is moved within the track system among several different stations, by for example, a robotic arm. At each station, a different processing step is completed.

A typical coat/develop track machine or system 10 is illustrated schematically in FIG. 1. Here, a wafer 12 is moved with, for example, a robotic arm within the environmental chamber 14 of coat/develop track machine 10. Chamber 14 has constant airflow of filtered, humidity-controlled air. Machine 10 moves wafer 12 among several different stations/units.

For example, machine 10 moves wafer 12 to a first dispense unit 16. The first dispense unit 16 applies, for example, an antireflective coating onto the wafer 12. Next, machine 10 moves wafer 12 to a second dispense unit 18 where the photo-resist is applied to the wafer. It should be noted that on some coat/develop track machines 10 the antireflective coating and the photo resist are applied at the same coat bowl by different dispense units.

Wafer 12 is moved to a third station 20 where a bake or cure step removes residual solvent and anneals the film. Wafer 12 is then moved to a projection system 22 for the exposure process step. Here, projection system 22 is either linked to or stand-alone from machine 10. Projection system 22 exposed the coated wafer to some form of patterned radiation to create a latent image in the resist layer. The quality of the latent image is dependent on exposing hardware, the physics and chemistry of the interaction between the radiation and the resist, and in case of mask systems, the quality of the mask.

Finally, machine 10 moves the wafer 12 to a developer dispense station 23 where the developer is applied to dissolve the un-activated photo-resist.

Alternately, machine 10 does not move wafer 12 from station/unit to station/unit. Rather, machine 10 is adapted to move nozzles 24 coupled to each dispensing unit 16 and 18 to wafer 12 as needed. Nozzles 24 are commonly stored in a nozzle bath that prevents the nozzles from drying out and/or from becoming contaminated with extraneous particles.

For example, such photolithography coat/develop track machines 10 are commercially available from FSI International, TEL Incorporated, and such projection systems 22 are commercially available from ASM Lithography, Canon Corporation, and the like.

In order to increase the speed and capabilities of semiconductors, the circuit pattern on the wafer has been made smaller such that more circuit patterns are included on the semiconductor (i.e., higher density circuit patterns). Smaller circuit patterns mean that the resolution of the circuit pattern is typically on the order of sub-microns, and sub-sub microns, which requires precise dispensing of the chemical solutions described above.

Moreover, the techniques used for applying the chemical solutions to wafers 12 require precise dispensing of the solutions. Spin coating has long been accepted as a reliable method to coat wafer 12 with solutions of acceptable thickness, uniformity, adhesion, and defect levels. Spin coating is accomplished by flooding wafer 12 with an antireflective coating/resist solution and rapidly rotating it at a constant speed between 1,000 and 10,000 revolutions per minute until the solution is dry, leaving a thin film of the antireflective coating/resist solution on the wafer.

For example, two types of spin coating programs include dynamic spin coating and static spin coating. During dynamic spin coating, the desired amount of chemical solution is dispensed to the center of wafer 12 while it is spinning. However, during static dispense coating, the chemical solution is applied to the center of wafer 12 while it is idle, after the chemical application the wafer begins to rotate and spin until the film is dry. Such spin coating occurs in a coat bowl assembly 25.

Imprecise dispensing of chemical solutions onto wafer 12 leads to physical defects in the semiconductor produced from the wafer. Additionally, since micro lithography solutions are typically expensive it is important that the dispense units do not waste the chemical solutions.

Plumbed dispense units for coat/develop track machine machines 10 have been developed for the manufacture of semiconductors in large-scale production, namely where a large number of semiconductors are manufactured at a time, thus requiring large volumes of chemical solutions. Plumbed dispense units require long lengths of pipe or tubing from a remote reservoir of solution to the coat bowl assembly 25. For example, U.S. Pat. No. 5,527,161 to Bailey et al and U.S. Pat. No. 5,878,918 to Liao et al. provide such manufacturing scale, plumbed dispensing units. However, such plumbed dispensing units have proven too expensive, and inefficient for development or lab use, namely operations where a small number of semiconductors are manufactured at a time such as manufacturers of semiconductor grade chemicals for which extensive testing of its chemicals is required.

SUMMARY

A low volume-dispense unit for dispensing a chemical solution in small-scale manufacture of semiconductors is provided. The low volume-dispense unit includes a stand, a pressurized reservoir, a pneumatic valve assembly, a dispensing nozzle, and a flow path defined by the pressurized reservoir, pneumatic valve assembly, and dispensing nozzle. The stand is connectable to a semiconductor coat/develop track machine and supports the reservoir, the pneumatic valve assembly, and the dispensing nozzle. The pressurized reservoir holds a chemical solution. The pneumatic valve assembly includes a stop portion and a suck-back portion. The stop portion is in fluid communication with the pressurized reservoir, while the suck-back portion is in fluid communication with the dispensing nozzle. The dispensing nozzle is extendable into the semiconductor coat/develop track machine. The flow path has a low hold-up volume and materials sufficient to withstand the chemical solution. The stop portion is movable from a closed position sealing the flow path, to an open position unsealing the flow path. The stop portion is moved from the closed position by a pneumatic pressure, and is returned to the closed position upon removal of the pneumatic pressure. The chemical solution is dispensed into the semiconductor coat/develop track machine at the dispensing nozzle from the pressurized reservoir when the stop portion is in the open position. The suck-back portion is movable from a first position when the stop portion is in the closed position to a second position when the stop portion is in the open position. The stop portion is moved to the first position by the pneumatic pressure, and is returned to the first position upon removal of the pneumatic pressure to suck-back chemical solution in the flow path from the nozzle.

An apparatus for dispensing a chemical solution in the small-scale manufacture of semiconductors is provided. The apparatus includes a stand, a pneumatic syringe of a chemical solution, means for filtering the chemical solution, a two-stage diaphragm valve assembly, a dispense outlet, and a solenoid. The stand is connectable to a semiconductor coat/develop track machine. The semiconductor coat/develop track machine has a source of incompressible fluid and a control circuit. The pneumatic syringe is connectable to the source of incompressible fluid to receive a dispensing pressure. The filtering means are in fluid communication with the pneumatic syringe. The two-stage diaphragm valve assembly has a flow control stage and-a drip prevention stage. The filtering means is in fluid communication with the flow control stage, and the flow control stage is in fluid communication with the drip prevention stage. The dispense outlet is in fluid communication with the drip prevention stage. The pneumatic syringe, filtering means, two-stage diaphragm valve assembly, and dispense outlet define a flow path into the semiconductor coat/develop track machine. The flow path has a low retention volume and has materials sufficient to withstand the chemical solution. The solenoid is connectable to the source of incompressible fluid and to the control circuit. The solenoid selectively applies and removes an activation pressure from the flow control stage and the drip prevention stage. The flow control stage has a flow diaphragm movable between a closed position and an open position. Application of the activation pressure moves the flow diaphragm to the open position such that the chemical solution is drivable through the flow path by the dispensing pressure, and removal of the activation pressure returns the flow diaphragm to the closed position. The drip prevention portion has a suction diaphragm movable between a first position and a second position. Application of the activation pressure moves the suction diaphragm to the second position, and removal of the activation pressure returns the suction diaphragm to the first position to generate a suck-back force in the flow path at the dispense outlet.

A method for dispensing a chemical solution in the small-scale manufacture of semiconductors is provided. The method includes associating a dispensing unit and a semiconductor coat/develop track machine and associating a pneumatic syringe of a chemical solution with the dispensing unit. The pneumatic syringe is in fluid communication with a flow control diaphragm of a two-stage valve assembly. The flow control diaphragm is in fluid communication with a drip prevention diaphragm of the two-stage valve assembly. The drip prevention diaphragm is in fluid communication with a dispensing nozzle. The pneumatic syringe, two-stage valve assembly, and dispensing nozzle define a low retention volume flow path. A dispensing pressure is applied to the pneumatic syringe. The flow control diaphragm is opened to allow the dispensing pressure to drive the chemical solution from the dispensing nozzle while the drip prevention diaphragm is moved from a first position to a second position. The flow control diaphragm is closed to prevent the dispensing pressure from driving the chemical solution from the dispensing nozzle, while the drip prevention diaphragm is returned to the first position to generate a suck-back force in the flow path at the dispensing nozzle.

The above described and other features are appreciated and understood from the following detailed description, drawings, and appended claims.

DESCRIPTION OF THE PREFERRED EMBODIMENT

Figure 1:
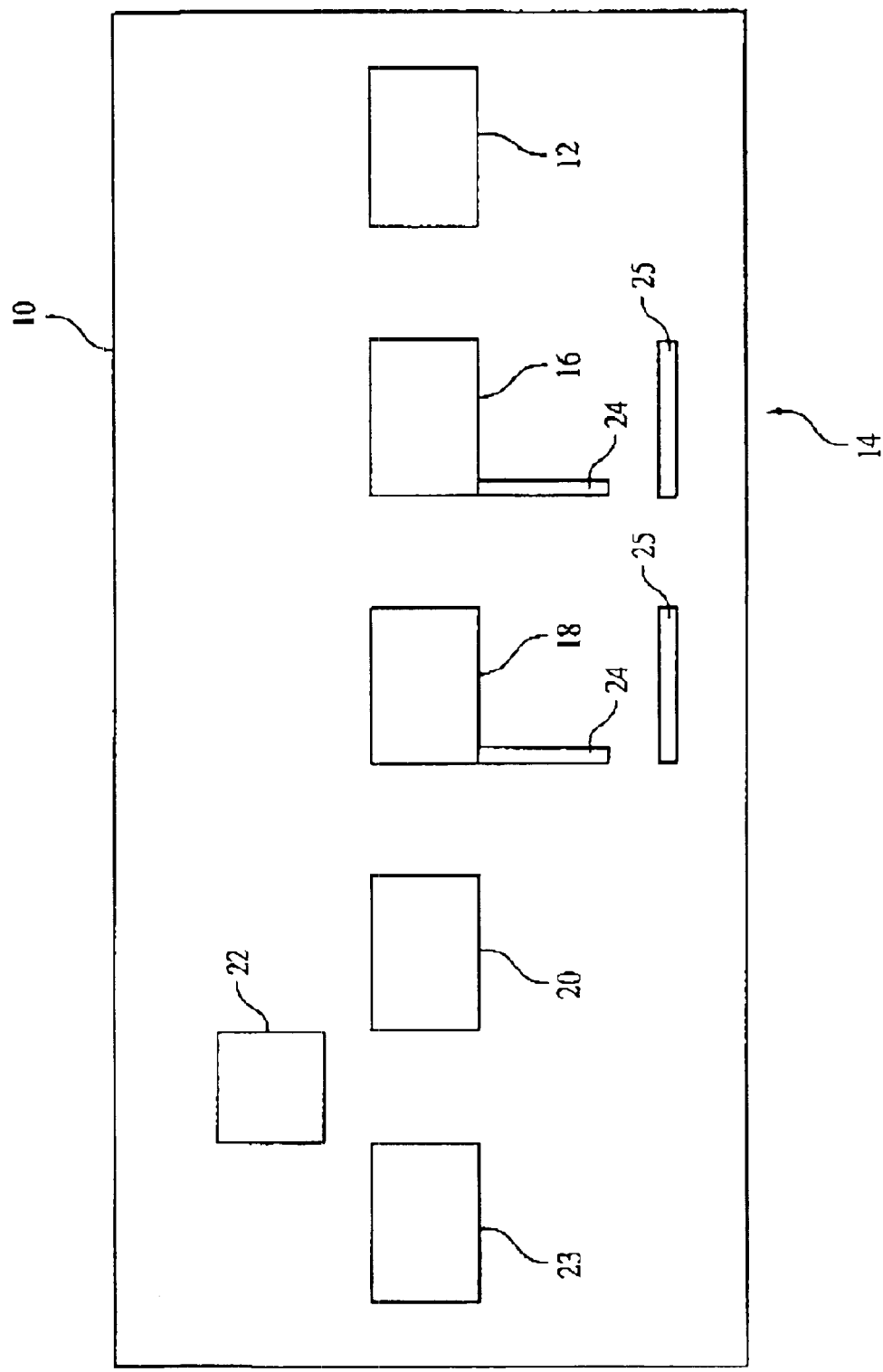
FIG. 1 is a schematic diagram of a prior art photolithography process.
Figure 2:
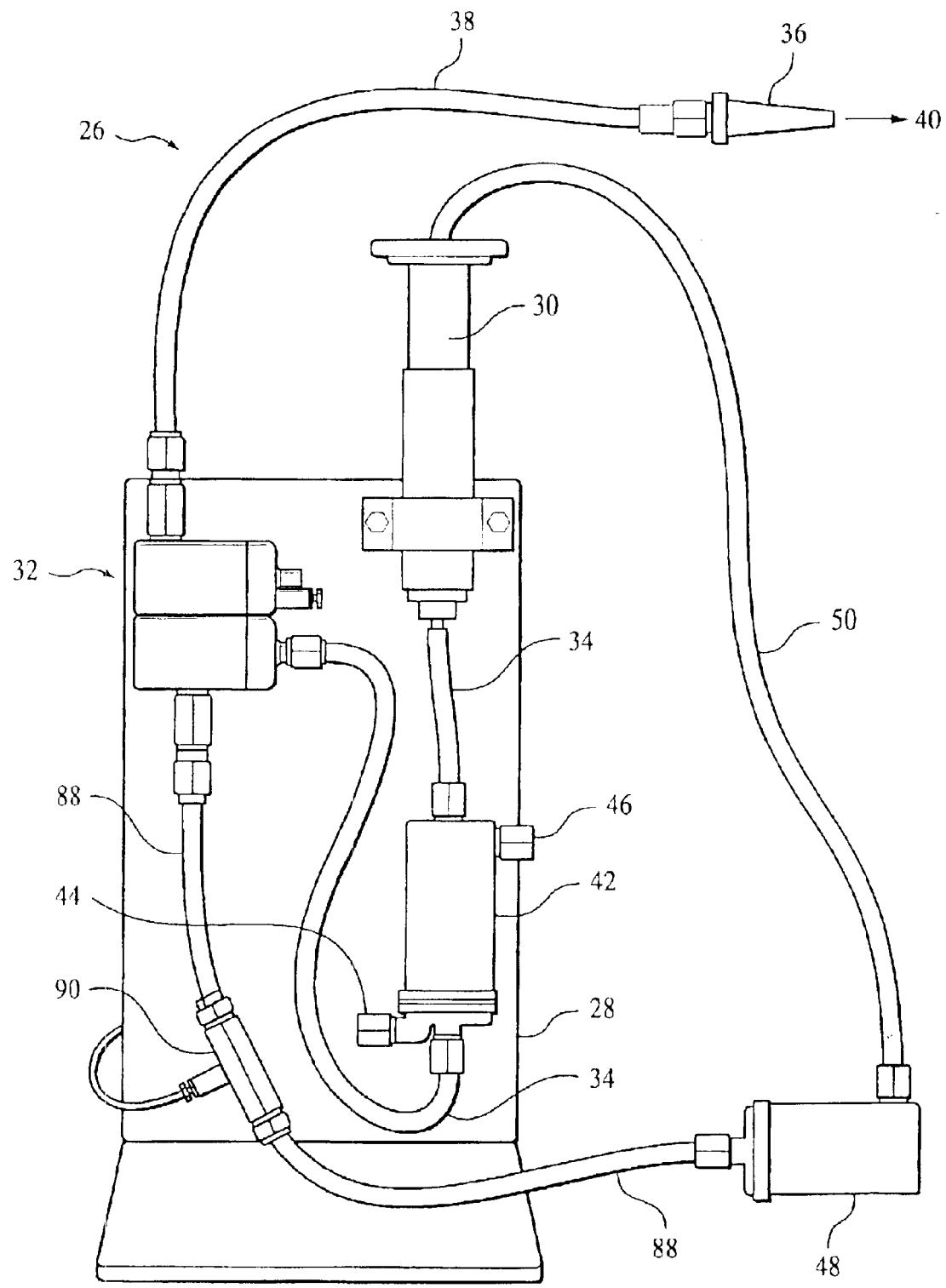
FIG. 2 is a front view of an exemplary embodiment of a dispensing unit.

Referring now to FIG. 2, an exemplary embodiment of a low volume dispense unit 26 is illustrated. Dispense unit 26 is adapted to dispense chemical solutions such as those used in the manufacture of semiconductors in conjunction with existing coat/develop track machines 10. Dispensing unit 26 is mounted on a support or stand 28. Stand 28 is adapted to be secured, for example, on machine 10 such that it's dispense nozzles extend into the machine at the appropriate coat bowl station. Dispense unit 26 dispenses chemical solutions in low volumes and with high accuracy, while generating little or no particulate matter in the chemical solution. Moreover, unit 26 is adapted to provide low overall hold-up or residual volume such that waste of the chemical solution is minimized.

Unit 26 includes a liquid reservoir 30 for storing one or more charges of chemical solution. Since the chemical solutions are expensive, reservoir 30 is a low volume reservoir, typically about 30 cubic centimeters (cc). Preferably, reservoir 30 is a pneumatic syringe. Reservoir 30 is in fluid communication with a pneumatic valve assembly 32 by means of a conduit 34. Valve assembly 32 is in fluid communication with a dispense nozzle 36 by means of a conduit 38. Thus a flow path 40 is defined through unit 26, namely from reservoir 30 through conduit 34 to valve assembly 32, and from the valve assembly through conduit 38 to nozzle 36. Pneumatic valve assembly 32 and conduits 34 and 38, similar to reservoir 30, have a low hold-up volume, namely about 5 ml.

The chemical solutions to be dispensed by dispensing unit 26 are often corrosive in nature. Thus, flow path 40 is made of materials effective to withstand the corrosive nature of the chemical solution. For example, reservoir 30, conduit 34, and conduit 38 are preferably are in preferably a polyethylene-based materials, such as poly tetrafluoro ethylene("PTFE" or Teflon™, available from DuPont), while valve assembly 32 and nozzle 36 are made from stainless steel or fluoropolymer-based materials, such as Teflon™ PTFE.

Figure 3:
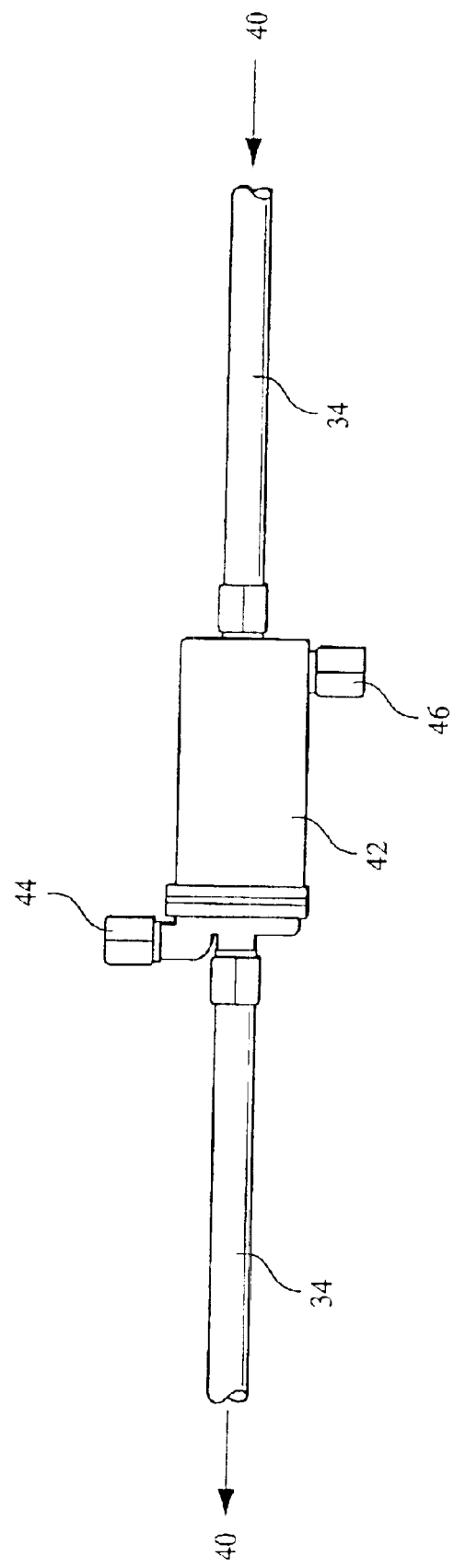
FIG. 3 is a side view of an exemplary embodiment of a filter in the dispensing unit of FIG. 2.

In a preferred embodiment, a filter 42 is included in conduit 34 (e.g., in flow path 40). Filter 42 is placed after conduit 34 and before valve assembly 32, since the filter cannot be placed at point of use after the valve assembly since in this position suck back (described below) would not be possible. Filter 42, illustrated in FIG. 3, is preferably a sub micron filter cartridge having an air purge connection 44 for purging air from conduit 34 during the priming of dispensing unit 26 and a drain 46. Optionally, drain 46 is usable to re-circulate the chemical solution from filter 42 back into reservoir 30. Similar to reservoir 30 and pneumatic valve assembly 32, filter 42 has a low hold-up volume of about 5.5 ml, and is made of materials sufficient to withstand the chemical solution, preferably fluoropolymer based materials, such as Teflon™ PFA available from DuPont.

Filter 42 is adapted to remove particles from the chemical solution having a particle size larger than about 0.10 to 0.05 microns. By way of example, filter 42 is a Mini Kleen-Change® filter commercially available from Pall Corporation. It has been determined that conduits 34 and 38 having larger internal diameters, namely about ⅛ inch (25.53 millimeters) or larger, results in a lower pressure drop across filter 42 and provide better flow through dispensing unit 26.

In use, the chemical solution is dispensed from nozzle 36 by application of a pressure to reservoir 30. As illustrated in FIG. 2, a source of incompressible fluid 48 supplies pressure to reservoir 30 by means of a conduit 50. The source of incompressible fluid 48 is a source of inert gas such as, but not limited to, nitrogen. Pressure in reservoir 30 drives the chemical solution through flow path 40 of dispensing unit 26.

Figure 4:
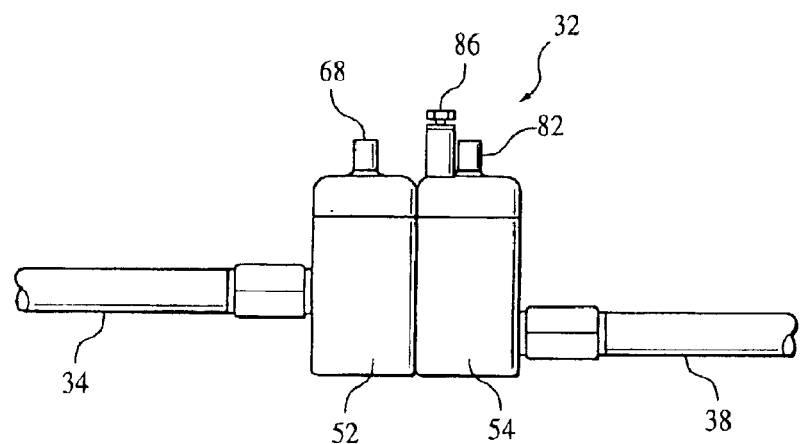
FIG. 4 is a perspective view of an exemplary embodiment of a valve.
Figure 5:
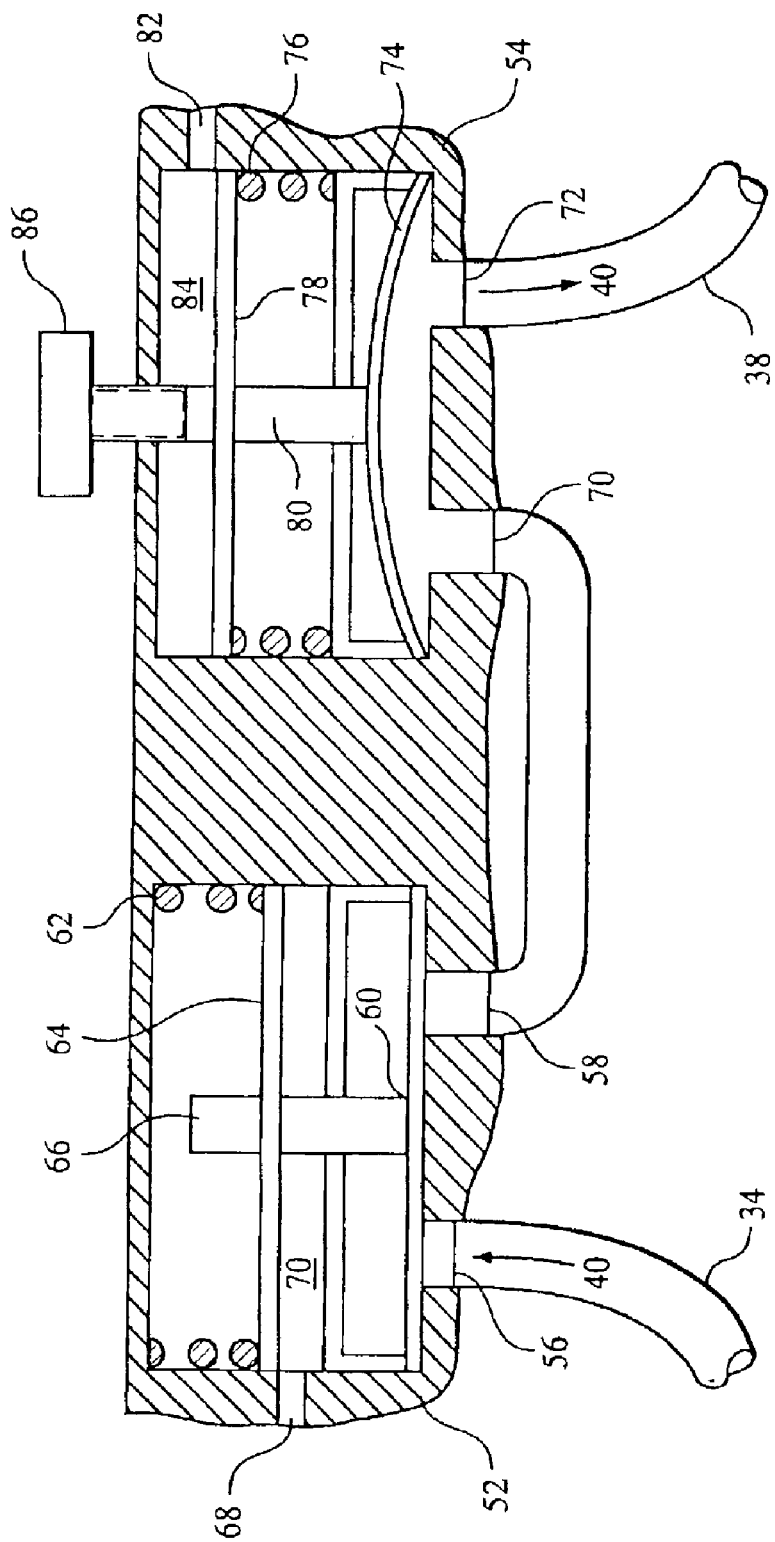
FIG. 5 is a cross sectional view of the valve of FIG. 4 in a closed or normal position.
Figure 6:
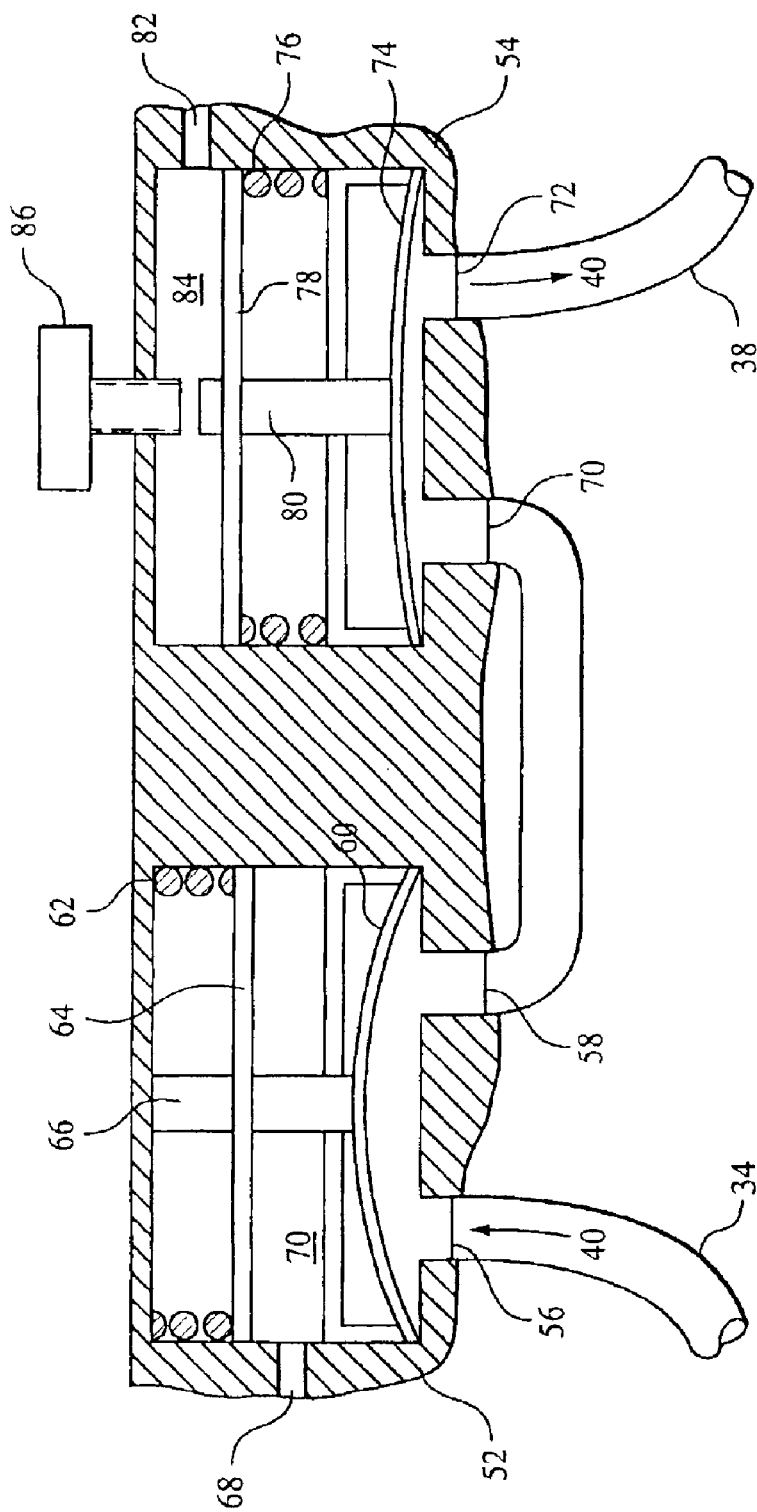
FIG. 6 is a cross sectional view of the valve of FIG. 4 in an open or activated position.

Valve assembly 32 is a two-stage diaphragm valve having a flow control stage and a drip prevention stage. For example, such two-stage diaphragm valves are commercially available from Saint-Gobain Performance Plastics. Referring now to FIGS. 4–6, an exemplary embodiment of pneumatic valve assembly 32 is illustrated. For the purpose of clarity, pneumatic valve 32 is illustrated in FIG. 4 omitting various components of dispensing unit 26.

Valve 32 includes a stop portion 52 and a suck-back portion 54. Stop portion 52 is adapted to seal or close flow path 40 in a closed or normal position, and is adapted to open the flow path in an open or activated position. Accordingly, the selective opening and closing of flow path 40 by stop portion 52 selectively allows pressure applied to reservoir 30 to drive the chemical solution through the flow path to dispensing nozzle 36 to dispense a shot of the chemical solution. While suck-back portion 54 is adapted to provide a negative pressure or "suck-back" pressure to flow path 40 after or substantially simultaneously to the closing of stop portion 52. Thus, suck-back portion 54 draws back a minuet portion of the chemical solution in conduit 38 from dispense nozzle 36, which prevents inadvertently dripping the chemical solution from the nozzle after each dispense cycle. The "dispense cycle" is referred herein as the opening of stop portion 52 for a predetermined period of time, the closing of the stop portion, and the activation of suck-back portion 54.

Stop portion 52 has an inlet 56 and an outlet 58 sealed by a diaphragm 60. Diaphragm 60 is biased to the closed position shown in FIG. 5 preventing the flow of the chemical solution from inlet 56 to outlet 58. Inlet 56 is in fluid communication with conduit 34, while outlet 58 is in fluid communication with suck-back portion 54. Preferably, diaphragm 60 is biased by a spring 62 acting on a pressure plate 64. A plunger 66 operatively connects diaphragm 60, spring 62, and pressure plate 64. Stop portion 52 includes a pressure fitting 68 in fluid communication with a cavity 70. Inert gas is selectively supplied to cavity 70 from source of incompressible fluid 48 as described below.

Application of pressure to cavity 70 acts on pressure plate 64 to overcome the force of spring 62, moving the pressure plate upward. Movement of pressure plate 64 upward moves plunger 66 upward, which opens diaphragm 60 as shown in FIG. 6 Diaphragm 60, in the open position, allows the flow of the chemical solution from inlet 56 to outlet 58. After the predetermined period of time, pressure is removed from cavity 70 such that spring 62 returns diaphragm 60 to the closed position. Namely, the force of spring 62 is sufficient to overcome to pressure supplied by source 48 to flow path 40.

Suck-back portion 54 has an inlet 70 and an outlet 72 sealed by a diaphragm 74. Inlet 70 is in fluid communication with outlet 58 of stop portion 52, while outlet 72 is in fluid communication with conduit 38. Diaphragm 74 is normally biased to a first position shown in FIG. 5. Preferably, diaphragm 74 is biased to the first position by a spring 76 acting on a pressure plate 78. A plunger 80 operatively connects diaphragm 74, spring 76, and pressure plate 78. Suck-back portion 54 includes a pressure fitting 82 in fluid communication with a cavity 84. Inert gas is selectively supplied to cavity 84 from source of incompressible fluid 48 as described below. Application of pressure to cavity 84 acts on pressure plate 78 to overcome the force of spring 76 and pressure in flow path 40, moving the pressure plate downward. Movement of pressure plate 78 downward moves plunger 80 downward, which in turn moves diaphragm 74 to a second position shown in FIG. 6.

In operation, when stop portion 52 is in its normal or closed position, suck-back portion 54 is in its first position, and when the stop portion is in its open position, the suck-back portion is in its second position. Thus after the predetermined period of time, the pressure is removed from cavity 84 such that spring 76 returns diaphragm 74 to the first position. Movement of diaphragm 74 from the second position to the first position creates the negative pressure or "suck-back" pressure in flow path 40 after or substantially simultaneously to the closing of stop portion 52. Thus, suck-back portion 54 draws back a minuet portion of the chemical solution in conduit 38 from dispense nozzle 36.

It should be recognized that stop portion 52 is described above by way of example as a spring closed, pneumatically opened diaphragm. Other methods of opening the diaphragm such as spring biasing, and other methods of closing the diaphragm such as pneumatic pressure, and combinations thereof, are contemplated. Similarly, it should be recognized that suck-back portion 54 is described above by way of example, and that other methods of moving between the first and second positions are contemplated.

Suck-back portion 54 optionally includes a suck-back control dial 86. Dial 86 is adapted to control the throw of plunger 80. Namely, movement of dial 86 into cavity 84 overcomes spring 76 to urge diaphragm 74 downward. This downward movement of diaphragm 70 decreases the difference between the first and second positions, thus decreasing the amount of suck-back. Conversely, movement of dial 86 out of cavity 84 allows spring 76 to urge diaphragm 74 upward. This upward movement increases the difference between the first and second positions, thus increasing the amount of suck-back.

Figure 7:
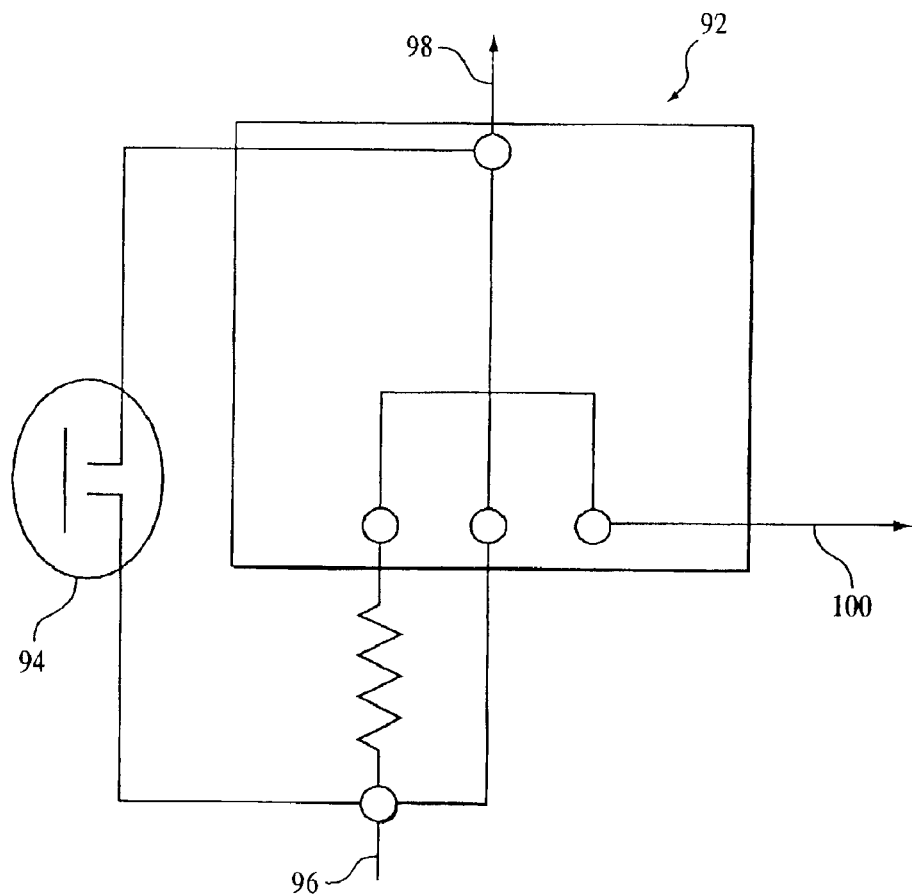
FIG. 7 is a schematic diagram of an exemplary embodiment of an activation circuit for the dispensing unit of FIG. 2.

A conduit 88 is adapted to supply cavity 70 and cavity 84 with pressure from source of incompressible fluid 48 as illustrated in FIG. 2. A solenoid 90 is opened to supply pressure to cavity 70 and 84, and is closed to vent pressure from the cavities. A control circuit 92 for controlling the dispense cycles of dispensing unit 26 with respect to machine 10 is illustrated in FIG. 7. Control circuit 92 includes a button 94 adapted to selectively connecting/disconnect dispensing unit 26 and machine 10 to source of control power 96. Activating button 94 sends a dispense signal 98 to solenoid 90 to open the solenoid for the predetermined time. The predetermined period of time is a function of the amount of the chemical to be dispensed, the size of flow path 40, and the amount of pressure applied to reservoir 30. The button 94 is activated by electronic methods such as logic with a control program of the machine 10, or alternately by manual means such as a push button.

Similarly, activating button 94 sends an activation signal 100 to machine 10. As discussed above, at least three techniques are used by machine 10 for applying the chemical solution to wafer 12. By way of example, in the method where machine 10 rotates wafer 12 after dispensing unit 26 completes the dispense cycle, signal 100 is used by the machine to start the centrifugation of the wafer after the predetermined period of time has elapsed.

To set up dispense unit 26 for use, reservoir 30 is provided with one or more charges of chemical solution. Solenoid 90 is connected to source 48 via conduit 88 and to circuit 92 for receipt of dispense signal 98. Machine 10 is also connected to circuit 92 for receipt of signal 100. Reservoir 30 is connected to source 48 via conduit 50 to drive the chemical solution through flow path 40. If filter 42 is present in conduit 34, air is purged from flow path 40 by opening vent 44 until the chemical solution has completely filled the filter. After closing vent 44, air from flow path 40 is further purged by activating valve 32 by means of button 94. Here, button 94 is activated a plurality of times such that the chemical solution from reservoir 30 is drive through flow path 40, thus removing any air from the flow path.

Once set up, dispensing unit 26 is ready for use. Here, a wafer 12 is provided to nozzle 36. Button 94 is depressed, sending dispense signal 98 to solenoid 90. Solenoid 90 opens to provide a pressure to cavity 70 of stop portion 52 and cavity 84 of suck-back portion 54 for the predetermined period of time. The pressure in cavity 70 moves diaphragm 60 to its open position allowing the flow of the chemical solution from conduit 34 to inlet 70 of suck-back portion 54. Similarly, the pressure in cavity 84 moves diaphragm 74 to its second position, while the flow of the chemical solution is permitted from inlet 70 to conduit 38, and hence to nozzle 36.

After the predetermined time has elapsed, solenoid 90 closes and vents the pressure from cavities 70 and 84. Spring 62 returns diaphragm 60 to its closed position stopping the flow of the chemical solution from conduit 34 to inlet 70 of suck-back portion 54. Similarly, spring 76 returns diaphragm 74 to its first position, sucking back a minuet portion of the chemical solution from conduit 38, and hence from nozzle 36 to prevent drips. Activation of button 94 also provides signal 100 to machine 10. In turn, machine 10 for example rotates wafer 12 to spread the chemical solution across the wafer.

Accordingly, dispensing unit 26 is adapted for use in the manufacture of a small number of semiconductors, namely lab or development scale manufacture settings. Moreover, unit 26 is adapted to provide low hold-up or residual volume (e.g., about 30 ml) such that waste of the chemical solution is minimized.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A low volume-dispense unit for dispensing a chemical solution in the small-scale manufacture of semiconductors, comprising:

a stand connectable to a semiconductor coat/develop track machine;

a pressurized reservoir for a chemical solution;

a pneumatic two-stage diaphragm valve assembly, said pneumatic two-stage diaphragm valve assembly including a stop portion in fluid communication with said pressurized reservoir and a suck-back portion;

a dispensing nozzle in fluid communication with said suck-back portion, said dispensing nozzle being extendable into said semiconductor coat/develop track machine, said stand supporting said reservoir, said pneumatic valve assembly, and said dispensing nozzle; and a flow path being defined by said pressurized reservoir, said pneumatic two-stage diaphragm valve assembly, and said dispensing nozzle, said flow path having a low hold-up volume and having materials sufficient to withstand said chemical solution, said stop portion being movable from a closed position sealing said flow path to an open position unsealing said flow path by a pneumatic pressure, and being returned to said closed position upon removal of said pneumatic pressure, said chemical solution being dispensable into said semiconductor coat/develop track machine at said dispensing nozzle from said pressurized reservoir in said open position, and said suck-back portion being movable from a first position when said stop portion is in said closed position to a second position when said stop portion is in said open position by said pneumatic pressure, and being returned to said first position upon removal of said pneumatic pressure to suck-back said chemical solution in said flow path at said nozzle.

2. The low volume dispense unit of claim 1, wherein said pressurized reservoir is a pneumatic syringe receiving being pressurizeable from a source of incompressible fluid of said semiconductor coat/develop track machine.

3. The low volume dispensing unit of claim 2, wherein said pneumatic pressure is provideable to said pneumatic valve assembly from said source of incompressible fluid.

4. The low volume dispensing unit of claim 3, wherein said source of incompressible fluid is a source of nitrogen.

5. The low volume dispensing unit of claim 1, wherein said flow path is selected from the group consisting of polyethylene based materials and fluoropolymer based materials.

6. The low volume dispensing unit of claim 1, wherein said low hold-up volume is about 30 cubic centimeters.

7. The low volume dispensing unit of claim 5, wherein said flow path has an internal diameter of at least ⅛ inch.

8. The low volume dispensing unit of claim 5, wherein said flow path includes a filter disposed between and in fluid communication with said reservoir and said stop portion.

9. The low volume dispensing unit of claim 8, wherein said filter removes particles having a particle size larger than about 0.05 microns from said chemical solution.

10. An apparatus for dispensing a chemical solution in the small-scale manufacture of semiconductors, comprising:
a stand connectable to a semiconductor coat/develop track machine, said semiconductor coat/develop track machine having a source of incompressible fluid and a control circuit;
a pneumatic syringe of a chemical solution, said pneumatic syringe being connectable to said source of incompressible fluid to receive a dispensing pressure;
means for filtering said chemical solution, said filtering means being in fluid communication with said pneumatic syringe;
a two-stage diaphragm valve assembly having a flow control stage and a drip prevention stage, said filtering means being in fluid communication with said flow control stage, and said flow control stage being in fluid communication with said drip prevention stage;
a dispense outlet in fluid communication with said drip prevention stage, said pneumatic syringe, said filtering means, said two-stage diaphragm valve assembly, and said dispense outlet defining a flow path into said semiconductor coat/develop track machine, said flow path having a low retention volume and having materials sufficient to withstand said chemical solution; and
a solenoid connectable to said source of incompressible fluid and to said control circuit, said solenoid selectively applying and removing an activation pressure from said source of incompressible fluid to said flow control stage and said drip prevention stage, said flow control stage having a flow diaphragm movable between a closed position and an open position, application of said activation pressure moving said flow diaphragm to said open position such that said chemical solution is drivable through said flow path by said dispensing pressure, and removal of said activation pressure returning said flow diaphragm to said closed position, said drip prevention portion having a suction diaphragm movable between a first position and a second position, application of said activation pressure moving said suction diaphragm to said second position, and removal of said activation pressure returning said suction diaphragm to said first position to generate a suck-back force in said flow path at said dispense outlet.

11. The apparatus of claim 10, wherein said source of incompressible fluid is a source of nitrogen.

12. The apparatus of claim 10, wherein said flow path is selected from the group consisting of polyethylene based materials and fluoropolymer based materials.

13. The apparatus of claim 12, wherein said low retention volume is about 30 ml.

14. The apparatus of claim 13, wherein said flow path has an internal diameter of about ⅛".

15. The apparatus of claim 12, wherein said filtering means is a sub micron filter cartridge for removing particles from said chemical solution having a particle size larger than about 0.05 microns.

16. The apparatus of claim 10, wherein said flow diaphragm is normally biased to a closed position by a first spring and said suction diaphragm is normally biased to said first position by a second spring.

17. The apparatus of claim 16, further comprising:
a suck-back control dial operatively connected to said suction diaphragm, said suck-back control being adjustable to increase a differential between said first position and said second position to increase said suck-back force and being adjustable to decrease said differential to decrease said suck-back force.

18. A method for dispensing a chemical solution in the small-scale manufacture of semiconductors, comprising:
associating a dispensing unit and a semiconductor coat/develop track machine;
associating a pneumatic syringe of a chemical solution to said dispensing unit such that said pneumatic syringe is fluidly connected to a flow control diaphragm of a two-stage valve assembly, said flow control diaphragm being in fluid communication with a drip prevention diaphragm of said two-stage valve assembly, said drip prevention diaphragm being in fluid communication with a dispensing nozzle, wherein said pneumatic syringe, said two-stage valve assembly, and said dispensing nozzle defining a low retention volume flow path;
applying a dispensing pressure to said pneumatic syringe;
opening said flow control diaphragm to allow said dispensing pressure to drive said chemical solution from said dispensing nozzle and moving said drip prevention diaphragm from a first position to a second position; and
closing said flow control diaphragm to prevent said dispensing pressure from driving said chemical solution from said dispensing nozzle, and returning said drip prevention diaphragm to said first position to generate a suck-back force in said flow path at said dispensing nozzle.

19. The method of claim 18, further comprising: filtering said chemical solution between said pneumatic syringe and said two-stage valve assembly.

20. The method of claim 19, wherein said flow path is selected from the group consisting of polyethylene based materials and fluoropolymer based materials, said low hold-up volume is about 30 cubic centimeters, and said flow path has an internal diameter of at least 1/8 inch.

* * * * *